United States Patent
Xu et al.

(10) Patent No.: US 11,165,247 B2
(45) Date of Patent: Nov. 2, 2021

(54) PROTECTION CIRCUIT FOR TERMINAL CAMERA

(71) Applicant: Honor Device Co., Ltd., Shenzhen (CN)

(72) Inventors: Bo Xu, Xi'an (CN); Chao Wang, Xi'an (CN); Jie Dong, Xi'an (CN); Yi Wang, Xi'an (CN); Qiao Sun, Xi'an (CN); Zhiyong Sun, Xi'an (CN)

(73) Assignee: HONOR DEVICE CO., LTD., Shenzhen (CN)

( * ) Notice: Subject to any disclaimer, the term of this patent is extended or adjusted under 35 U.S.C. 154(b) by 0 days.

(21) Appl. No.: 17/051,977

(22) PCT Filed: May 15, 2018

(86) PCT No.: PCT/CN2018/086918
§ 371 (c)(1),
(2) Date: Oct. 30, 2020

(87) PCT Pub. No.: WO2019/210532
PCT Pub. Date: Nov. 7, 2019

(65) Prior Publication Data
US 2021/0167594 A1    Jun. 3, 2021

(30) Foreign Application Priority Data

May 2, 2018 (WO) ............... PCT/CN2018/085366

(51) Int. Cl.
*H02H 9/04* (2006.01)
*H05K 1/11* (2006.01)

(52) U.S. Cl.
CPC ............ *H02H 9/04* (2013.01); *H05K 1/115* (2013.01)

(58) Field of Classification Search
CPC .......... H02H 9/04; H02H 9/041; H05K 1/115; H04N 5/2253
USPC .......................................... 361/56
See application file for complete search history.

(56) References Cited

U.S. PATENT DOCUMENTS

| | | | | | |
|---|---|---|---|---|---|
| 5,592,353 | A | * | 1/1997 | Shinohara | G06F 1/305 361/23 |
| 5,986,862 | A | * | 11/1999 | Kim | H02H 9/046 361/56 |
| 8,493,680 | B2 | * | 7/2013 | Oh | G11B 5/09 360/46 |
| 10,890,734 | B1 | * | 1/2021 | Sharma | H02P 25/034 |
| 2014/0203751 | A1 | * | 7/2014 | Kurosawa | H02P 25/034 318/565 |

(Continued)

*Primary Examiner* — Sherman Ng
(74) *Attorney, Agent, or Firm* — Conley Rose, P.C.

(57) ABSTRACT

A protection circuit and a printed circuit board (PCB) for a terminal camera includes, in a configuration for coupling with a voice control motor (VCM), a drive circuit, a first circuit, a second circuit, a first protection system, a second protection system, and a third protection system. The first circuit and the second circuit are choke inductors or choke circuits including choke inductors, and are configured to couple to two ends of the VCM. The first protection system, the second protection system, and the third protection system are coupled to other key positions of the circuits. The devices are arranged on a top layer of the PCB, and a plurality of layers of the PCB are configured to route a signal based on design requirements.

20 Claims, 5 Drawing Sheets

(56) References Cited

U.S. PATENT DOCUMENTS

2015/0207449 A1\* 7/2015 Clendenen ............. H02H 9/042
                                                  318/400.22
2017/0160557 A1\* 6/2017 Bang ................... G02B 27/646
2017/0357144 A1\* 12/2017 Kim ..................... H04N 5/2257
2018/0017842 A1\* 1/2018 Hsu ......................... G03B 7/10

\* cited by examiner

PROTECTION CIRCUIT FOR TERMINAL CAMERA

CROSS-REFERENCE TO RELATED APPLICATIONS

This application is a U.S. National Stage of International Patent Application No. PCT/CN2018/086918 filed on May 15, 2018, which claims priority to International Patent Application No. PCT/CN2018/085366 filed on May 2, 2018. Both of the aforementioned applications are hereby incorporated by reference in their entireties.

TECHNICAL FIELD

This application relates to the field of terminal technologies, and in particular, to a protection circuit for a terminal camera.

BACKGROUND

As a screen-to-body ratio of a terminal increases, a camera component is very close to an antenna. In addition, when a complex circuit structure inside a camera matches a length of the antenna, the circuit structure receives a radio signal and reduces antenna efficiency. The circuit structure may also radiate an electromagnetic wave with a corresponding frequency, which reduces sensitivity of the antenna. A design of the antenna requires limiting the use of metal parts on the camera component. Therefore, a camera fastening bracket is a plastic bracket.

A voice coil motor cannot be effectively grounded due to the use of the plastic bracket, resulting in electrostatic discharge (electrostatic discharge, ESD). Electrostatic charge flows to a voice coil motor shell of the camera through a camera lens on a terminal housing, causes secondary discharge to an internal coil, and flows to a camera substrate through the coil. This affects antenna sensitivity, and damage a camera drive circuit, resulting in photographing exceptions such as focusing failure, screen freezing, and artifacts, and other problems such as a system crash. Currently, an electrostatic discharge ESD problem is resolved by attaching a conductive fabric or a conductive copper foil to an outer side of a camera module to effectively avoid suspension of a voice coil motor VCM (Voice Coil Motor, VCM for short). However, this method cannot resolve the problem that the antenna is affected, and the cost increases.

SUMMARY

Embodiments of this application provide a voice coil motor VCM protection circuit, to prevent an antenna sensitivity from being affected by the voice coil motor VCM, and to prevent a camera drive circuit from being damaged due to electrostatic discharge, to avoid photographing exceptions such as focusing failure, screen freezing, and artifacts, and a system crash. To resolve the foregoing technical problems, the embodiments of this application provide the following technical solutions.

According to a first aspect, an embodiment of this application provides a voice coil motor VCM protection circuit, including:

a voice coil motor VCM;

a first circuit, where one end of the first circuit is connected to one end of the voice coil motor VCM at a first node, and the other end of the first circuit is connected to a power supply end VDD of the voice coil motor drive circuit at a third node;

a second circuit, where one end of the second circuit is connected to the other end of the voice coil motor VCM at a second node, and the other end of the second circuit is connected to a current return end ISINK of the voice coil motor drive circuit at a fifth node;

a first protection module, where one end of the first protection module is connected to the third node, and the other end of the first protection module is connected to a digital ground DGND at a fourth node;

a second protection module, where one end of the second protection module is connected to the third node, and the other end of the second protection module is connected to a reference ground VCM_GND of the voice coil motor drive circuit at a seventh node; and a third protection module, where one end of the third protection module is connected to the fifth node, and the other end of the third protection module is connected to the DGND at a sixth node. The foregoing connection manner of the circuits can effectively prevent the antenna from being affected.

The first circuit and the second circuit are choke circuits including a choke inductor.

With reference to the first aspect, the choke circuit may be one of the following cases:

a single choke inductor;

two or more choke inductors are connected in parallel;

one or more choke inductors are connected in parallel with one or more capacitors;

two or more choke inductors are connected in series; or one or more choke inductors and one or more capacitors are connected in parallel and then are connected in series with one or more choke inductors.

The foregoing method reduces the influence of the voice coil motor on the antenna at a particular frequency and at several different frequencies. With reference to the first aspect, the first protection module includes a first device and a second device that are connected in parallel, and may be one of the following cases:

the first device is a transient voltage suppressor TVS and the second device is a capacitor;

the first device is a transient voltage suppressor TVS and the second device is not configured; or the first device is a capacitor and the second device is not configured.

With reference to the first aspect, the second protection module includes a third device and a fourth device that are connected in parallel, and may be one of the following cases:

the third device is a transient voltage suppressor TVS and the fourth device is a capacitor; or the third device is a capacitor and the fourth device is not configured.

With reference to the first aspect, the third protection module includes a fifth device and a sixth device that are connected in parallel, and may be one of the following cases:

the fifth device is a transient voltage suppressor TVS and the sixth device is a capacitor; or the fifth device is a transient voltage suppressor TVS and the sixth device is not configured.

With reference to the first aspect, a model of capacitors of the first protection module and the second protection module is 0201, and a capacitance value is 1 nF to 4.7 µF.

With reference to the first aspect, for the first protection module, the second protection module, and the third protection module, when electrostatic discharge EDS of a transient voltage suppressor TVS is −15 V or +15 V and a reverse breakdown current is 1 mA, a breakdown voltage ranges from 6 V to 9 V, a turn-off voltage is greater than or equal to 4.5 V, a clamp voltage ranges from 7 V to 12 V, a maximum peak pulse current is 2.5 A, a junction capacitance is less than 33 pF, and general pulse test waveform ranges from 8 us to 20 us.

With reference to the first aspect, a capacitance value of the capacitor of the third protection module is 10 pF to 100 pF.

According to a second aspect, an embodiment of this application provides a printed circuit board PCB of a voice coil motor VCM protection circuit, where a top layer of the PCB includes a first circuit, a second circuit, a first protection module, a second protection module, and a third protection module.

The first circuit and the first protection module are connected and are arranged near a coil connection point of the voice coil motor VCM, and a current return end of the first protection module is directly connected to a DGND by using a through hole of the PCB.

The second protection module is connected to a drive circuit and is arranged near the drive circuit, and a current return end of the second protection module is directly connected to a VCM_GND by using a through hole of the PCB.

The second circuit and the third protection module are connected and are arranged near a coil connection point of the voice coil motor VCM, and a current return end of the third protection module is directly connected to a DGND by using a through hole of the PCB.

With reference to the second aspect, the first circuit and the second circuit are choke circuits including a choke inductor.

With reference to the second aspect, the choke circuit may be one of the following cases:
a single choke inductor;
two or more choke inductors are connected in parallel;
one or more choke inductors are connected in parallel with one or more capacitors;
two or more choke inductors are connected in series; or
one or more choke inductors and one or more capacitors are connected in parallel and then are connected in series with one or more choke inductors.

With reference to the second aspect, the first protection module includes a first device and a second device that are connected in parallel, and may be one of the following cases:
the first device is a transient voltage suppressor TVS and the second device is a capacitor;
the first device is a transient voltage suppressor TVS and the second device is not configured; or
the first device is a capacitor and the second device is not configured.

With reference to the second aspect, second protection module includes a third device and a fourth device that are connected in parallel, and may be one of the following cases:
the third device is a transient voltage suppressor TVS and the fourth device is a capacitor; or
the third device is a capacitor and the fourth device is not configured.

With reference to the second aspect, the third protection module includes a fifth device and a sixth device that are connected in parallel, and may be one of the following cases:
the fifth device is a transient voltage suppressor TVS and the sixth device is a capacitor; or
the fifth device is a transient voltage suppressor TVS and the sixth device is not configured.

With reference to the second aspect, wires of VCM_VDD and VCM_GND are routed in parallel and are completely wrapped by the DGND.

With reference to the second aspect, a wire between the VCM_VDD and a coil connection point of the voice coil motor VCM, and a wire between the ISINK and a coil connection point of the voice coil motor VCM are routed separately and are completely wrapped by the DGDN.

With reference to the second aspect, areas that correspond to wires and pads for connecting the first circuit and the second circuit to coil connection points of the voice coil motor (VCM), and that are on all layers of the PCB, from the top layer to the bottom layer, are empty. That is, they are not copper coated.

It can be learned from the foregoing technical solutions that, in the embodiments of this application, two ends of a voice coil motor VCM are connected to choke inductors, and protection modules are connected to a circuit at appropriate positions. This can avoid focusing failure, screen freezing, artifacts, and other problems caused by reduced antenna sensitivity and drive circuit failure due to electrostatic discharge.

DESCRIPTION OF EMBODIMENTS

Specific implementations of this application are described below with reference to the accompanying drawings.

Figure 1:
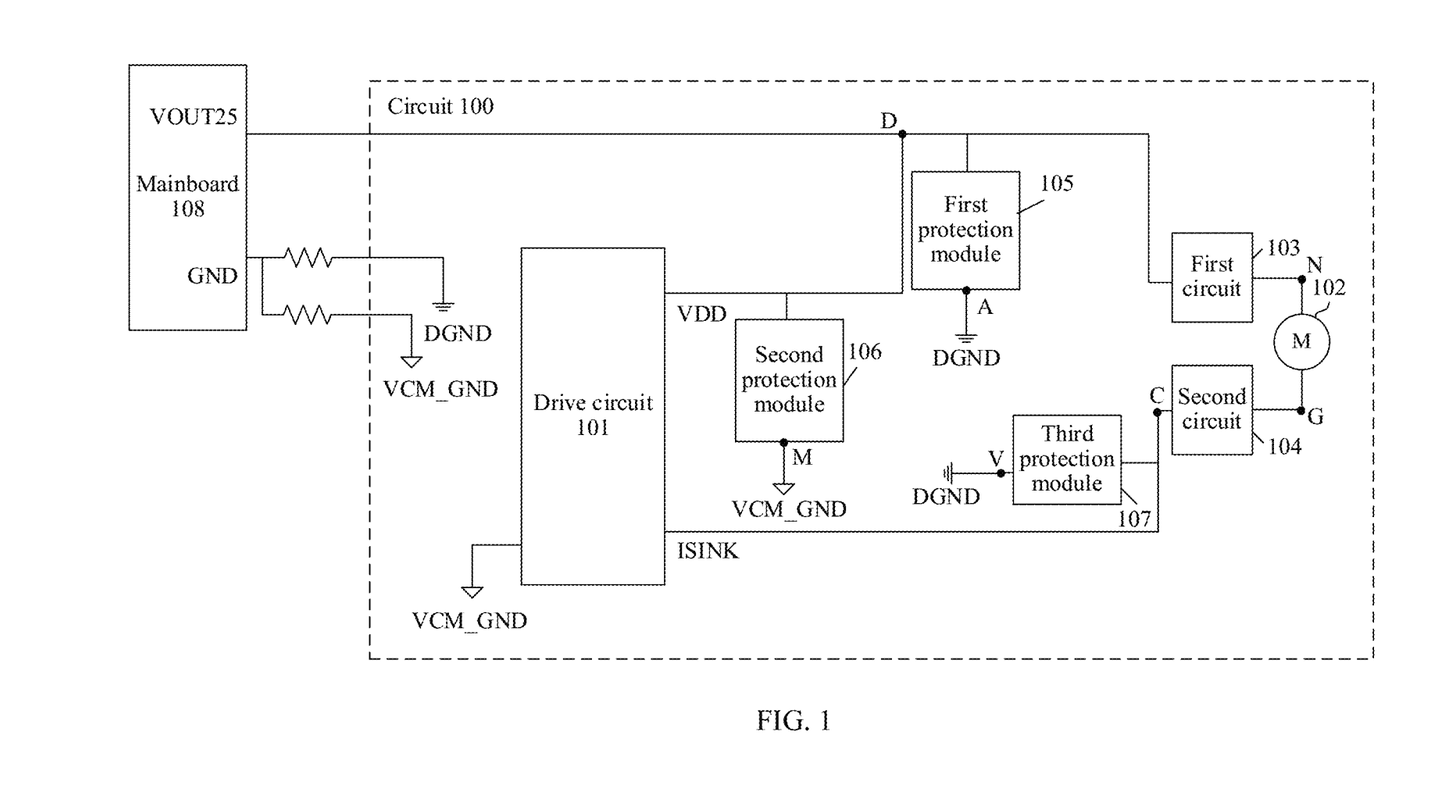
FIG. 1 is a schematic diagram of a protection circuit of a terminal camera according to an embodiment of this application.

As shown in FIG. 1, an embodiment of this application provides a protection circuit 100 applied to a terminal camera. The protection circuit includes a drive circuit 101, a voice coil motor VCM 102, a first circuit 103, a second circuit 104, a first protection module 105, a second protection module 106, a third protection module 107, and a mainboard 108.

One end of the voice coil motor VCM 102 is connected to one end of the first circuit 103 at a first node N, and the other end of the voice coil motor VCM 102 is connected to one end of the second circuit 104 at a second node G. The other end of the first circuit 103 is connected to a power supply end VDD of the voice coil motor drive circuit 102 at a third node D. One end of the first protection module 105 is connected to the third node D, and the other end of the first protection module 105 is connected to a digital ground DGND at a fourth node A. One end of the second protection module 106 is connected to the third node D, and the other end of the second protection module 106 is connected to a reference ground VCM_GND of the voice coil motor drive circuit 102 at a seventh node M. The other end of the second circuit 104 is connected to a current return end ISINK of the voice coil motor drive circuit 102 at a fifth node C. One end of the third protection module 107 is connected to the fifth node C, and the other end of the third protection module 107 is connected to the digital ground DGND at a sixth node V. The first circuit 103 and the second circuit 104 are choke circuits each including a choke inductor, and a first device of the first protection module 105 is a transient voltage suppressor (TVS).

The following further describes the embodiment of this application by using an operating process of the protection circuits of the camera. A power supply end VDD_2V8 of the mainboard 108 supplies power to the circuit 100. A ground end of the mainboard 108 is separately grounded: One is connected to the digital ground DGND, and the other is connected to a reference ground VCM_GND of the voice coil motor. The power supply end VDD_2V8 of the mainboard 108 supplies power to the circuit 100. When the current flows to the third node D, the current is divided into two currents, and one current flows to the first circuit 103. The first circuit 103 is configured to avoid impact of the voice coil motor on the antenna in a driving process. An inductance value of the choke inductor is selected according to a type of the antenna and a corresponding frequency, to reduce the impact of the voice coil motor drive circuit on the antenna. The first protection module 105 and the third protection module 107 are separately arranged near the voice coil motor coil 102, and are configured to release static electricity generated by electrostatic discharge ESD at two ends of the voice coil motor coil. The second protection module 106 is arranged near the drive circuit 101 and cooperates with the first protection module 105 and the third protection module 107, to protect the drive circuit 101 when the first protection module 105 and the third protection module 107 cannot achieve a good suppression effect on electrostatic discharge ESD. This can avoid problems such as focusing failure and screen freezing caused by drive circuit 101 failure. The other current flows to a VDD end of the drive circuit, and supplies power to the drive circuit.

In the foregoing embodiments, the first circuit and the second circuit are choke circuits including a choke inductor, and the choke circuits are configured to reduce the impact of the voice coil motor in the camera module on the antenna. When the choke circuits are one-stage filter circuits, the choke circuits reduce impact on an antenna at a specific frequency in the camera module. For example, when an inductance value of the selected choke inductor is 18 nH, an SFR of the choke inductor is about 2.5 GHz, and then the one-stage filter circuit relatively reduces the impact of the voice coil motor on the antenna at a frequency within 2.4 GHz to 2.5 GHz.

Figure 2A:
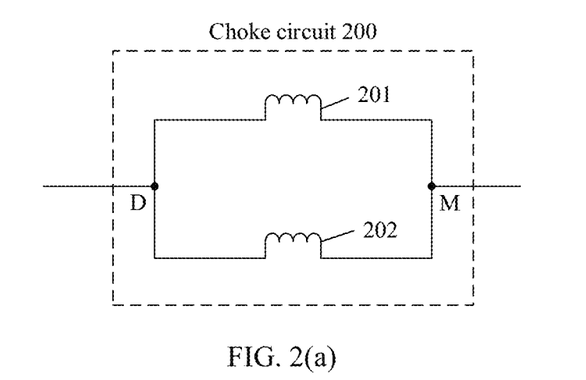
FIG. 2(a) is a schematic diagram in which a choke circuit is a one-stage filter circuit according to an embodiment of this application.
Figure 2B:
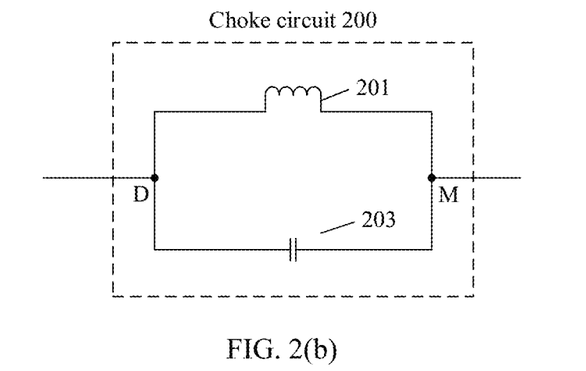
FIG. 2(b) is a schematic diagram in which a choke circuit is a one-stage filter circuit according to an embodiment of this application.

FIG. 2(a) and FIG. 2(b) are two cases in which choke circuits are one-stage filter circuits.

FIG. 2(a) is a possible case in which a choke circuit 200 is a one-stage filter circuit and includes two choke inductors that are connected in parallel. One end of a choke inductor 201 and one end of a choke inductor 202 are connected to a first node D, and the other end of the choke inductor 201 and the other end of the choke inductor 202 are connected to a third node M.

Further, a quantity of choke inductors that are connected in parallel may be increased or decreased based on an actual situation.

In another possible design, as shown in FIG. 2(b), the choke circuit 200 includes a choke inductor 201 and a capacitor 203 that are connected in parallel.

Further, the quantity of choke inductors that are connected in parallel and a quantity of capacitors that are connected in parallel may be increased or decreased based on an actual situation.

In the foregoing embodiment, when the choke circuit is a two-stage filter circuit, the choke circuit can reduce the impact of the voice coil motor on the antenna at different frequencies. For example, the choke inductors in the two-stage filter circuit may reduce the impact of the voice coil motor on the antenna at two different frequencies: a low frequency within 880 MHz to 960 MHz and a high frequency within 2.4 GHz to 2.5 GHz.

Figure 3A:
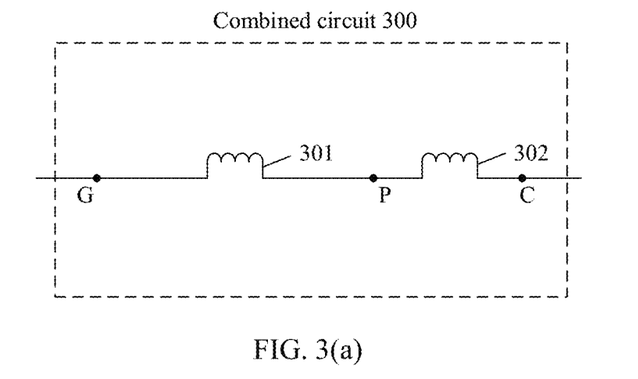
FIG. 3(a) is a schematic diagram in which a choke circuit is a two-stage filter circuit according to an embodiment of this application.
Figure 3B:
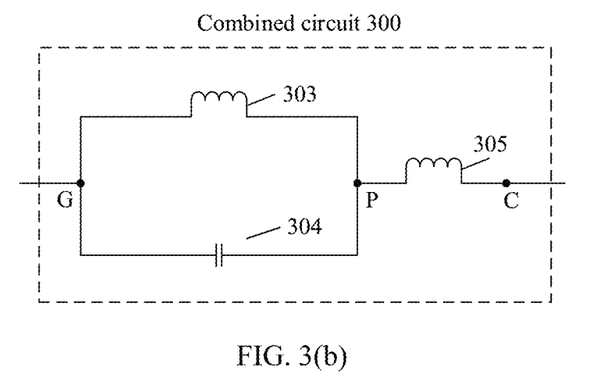
FIG. 3(b) is a schematic diagram in which a choke circuit is a two-stage filter circuit according to an embodiment of this application.

FIG. 3(a) and FIG. 3(b) are two cases in which the choke circuits are two-stage filter circuits.

FIG. 3(a) is a case in which a choke circuit 300 is a two-stage filter circuit. One end of a choke inductor 301 is connected to a second node G, the other end of the choke inductor 301 is connected in series to a choke inductor 302 at a node P, and the other end of the choke inductor 302 is connected to a fifth node C.

Further, a quantity of choke inductors that are connected in series may be increased or decreased based on an actual situation.

In another possible design, as shown in FIG. 3(b), in the choke circuit 300, a choke inductor 303 and a capacitor 304 are connected in parallel between a second node G and a node P, and then connected in series with a choke inductor 305 at the node P.

Further, quantities of choke inductors and capacitors that are connected in parallel, and a quantity of other choke inductors that are connected in series with the foregoing choke inductors and capacitors may be increased or decreased based on an actual situation.

Both the one-stage choke circuit 200 and the two-stage choke circuit 300 in the foregoing embodiments may be applied to the first circuit 103 and the second circuit 104. For example, the first circuit 103 is a one-stage choke circuit 200, and the second circuit 104 is a two-stage choke circuit 300. Alternatively, both the first circuit 103 and the second circuit 104 are two-stage choke circuits 300. This is not enumerated herein.

In a possible design, for the first circuit and the second circuit, through-current capabilities are greater than or equal to 150 mA, direct current impedances are less than 2Ω, and self-resonance frequencies SFRs are not less than an operating frequency of a neighboring antenna.

In a possible implementation, recommended inductance values of the choke inductors in the first circuit and the second circuit are 18 nH.

Figure 4:
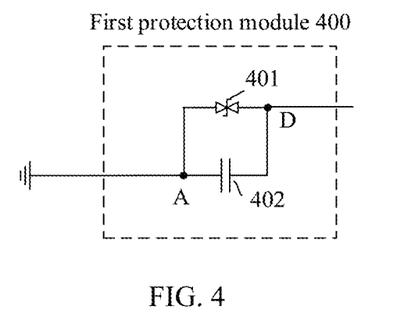
FIG. 4 is a schematic diagram of a first protection module according to an embodiment of this application.

As shown in FIG. 4, an embodiment of this application provides a first protection module 400, including a first device 401 and a second device 402 that are connected in parallel between a third node D and a fourth node A. The first device 401 is a transient voltage suppressor TVS (transient voltage suppressor, TVS for short), and the second device 402 is a capacitor.

In a possible implementation, in the first protection module 400, the first device 401 is a capacitor, the second device is not configured, and a branch circuit corresponding to the second device is disconnected.

In a possible implementation, in the first protection module 400, the first device 401 is a transient voltage suppressor TVS, the second device is not configured, and a branch circuit corresponding to the second device is disconnected.

In the foregoing embodiments, a capacitance value of the capacitor is 1 nF to 4.7 μF, and a model of the capacitor is 0201.

Figure 5:
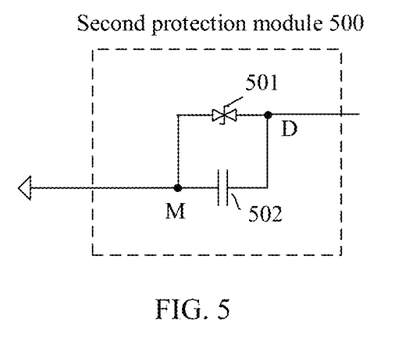
FIG. 5 is a schematic diagram of a second protection module according to an embodiment of this application.

As shown in FIG. 5, an embodiment of this application provides a second protection module 500, including a third device 501 and a fourth device 502 that are connected in parallel between a third node D and a seventh node M. The third device 501 is a transient voltage suppressor TVS, and the fourth device 502 is a capacitor.

In a possible implementation, in the second protection module 500, the third device 501 is a capacitor, the fourth device is not configured, and a branch circuit corresponding to the second device is disconnected.

Figure 6:
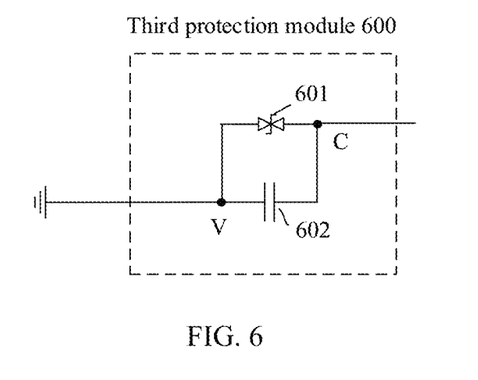
FIG. 6 is a schematic diagram of a third protection module according to an embodiment of this application.

As shown in FIG. 6, an embodiment of this application provides a third protection module 600, including a fifth device 601 and a sixth device 602 that are connected in parallel between a fifth node C and a sixth node V. The fifth device 601 is a transient voltage suppressor TVS, and the sixth device 602 is a capacitor.

In a possible implementation, the fifth device is a transient voltage suppressor TVS, the sixth device is not configured, and a branch circuit corresponding to the second device is disconnected.

In a possible implementation, a capacitance value of the sixth device 602, namely a capacitor, is 10 pF to 100 pF.

For the transient voltage suppressors TVSs in all the foregoing embodiments, when an electrostatic discharge EDS is −15 V or +15 V and a reverse breakdown current is 1 mA, a breakdown voltage ranges from 6 V to 9 V, a turn-off voltage is greater than or equal to 4.5 V, a clamp voltage ranges from 7 V to 12 V, a maximum peak pulse current is 2.5 A, a junction capacitance is less than 33 pF, and general pulse test waveform ranges from 8 us to 20 us.

Figure 7:
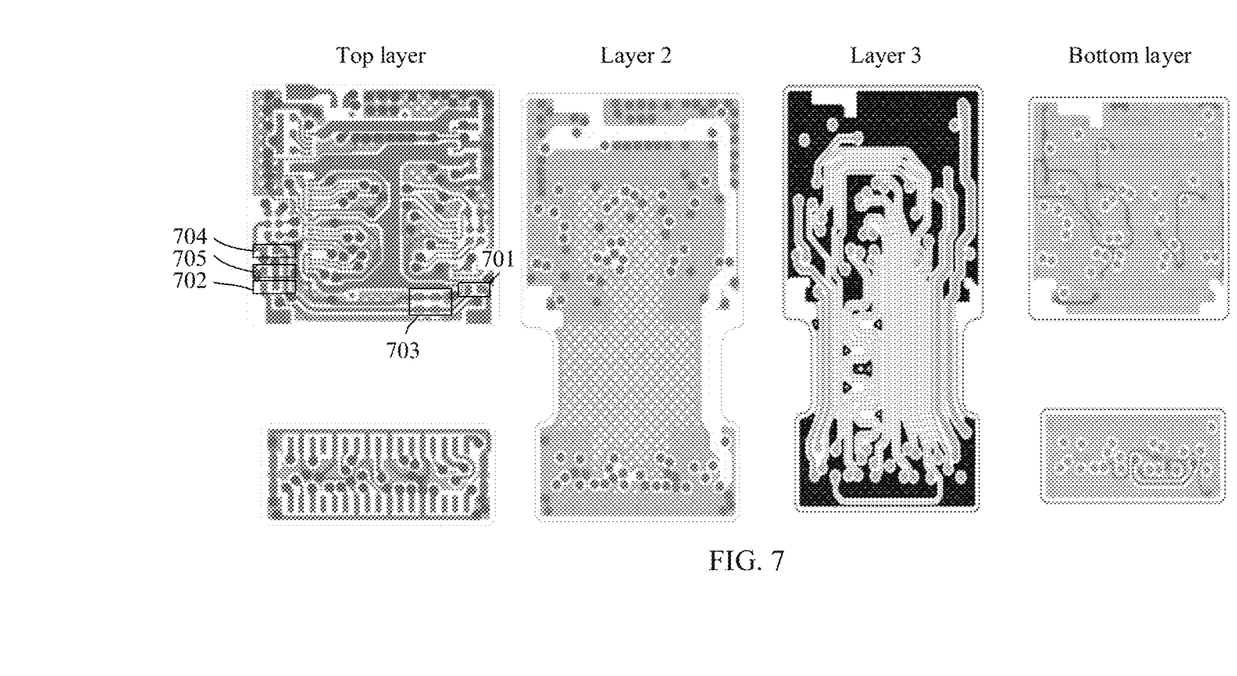
FIG. 7 is a schematic diagram of a printed circuit board PCB according to an embodiment of this application.

FIG. 7 is a schematic diagram of a printed circuit board PCB circuit of a voice coil motor VCM according to an embodiment of this application. The PCB has four circuit layers with a through hole, and devices of the voice coil motor VCM protection circuit are all arranged on a top layer.

Further, the top layer of the PCB includes a first circuit 701, a second circuit 702, a first protection module 703, a second protection module 704, and a third protection module 705. The first circuit 701 and the first protection module 703 are connected and are arranged near a coil connection point of the voice coil motor VCM, and a current return end of the first protection module 703 is directly connected to a DGND by using a through hole of the PCB. The second protection module 704 is connected to the drive circuit and is arranged near the drive circuit, and a current return end of the second protection module is directly connected to a VCM_GND by using a through hole of the PCB. The second circuit 705 and third protection module 702 are connected and are arranged near a coil connection point of the voice coil motor VCM, and a current return end of the third protection module is directly connected to a DGND by using a through hole of the PCB.

Further, the first circuit 701 and the second circuit 702 are choke circuits including a choke inductor.

In FIG. 7, the first circuit 701 and the second circuit 702 include only one choke inductor, and the second protection module 704 includes only a capacitor. The third protection module 705 includes only a transient suppression diode TVS.

Further, wires connected to the power supply end VCM_VDD and the reference ground VCM_GND of the drive circuit are routed in parallel and are completely wrapped by the DGND, to be isolated from other signals. A wire between the VCM_VDD and a connection point of the voice coil motor, and a wire between a circuit current return end ISINK and a connection point of the voice coil motor are routed separately and are completely wrapped by the DGND, to be isolated from other signals.

Further, areas that correspond to wires and pads for connecting the first circuit and the second circuit to coil connection points of the VCM, and that are on all layers of the PCB, from the top layer to the bottom layer, are empty. That is, they are not copper coated.

Further, three types of signal wires of the power supply end VCM_VDD, the reference ground VCM_GND, and the circuit current return end ISINK may be implemented on one or more layers of a top layer, a second layer and a third layer of the PCB according to a design.

In a possible design, the first circuit and the second circuit are choke circuits. When the choke circuit is a one-stage filter circuit, the choke circuit may be one of the following cases:

a single choke inductor;

two or more choke inductors are connected in parallel; or one or more choke inductors are connected in parallel with one or more capacitors.

Further, the choke circuit is a two-stage filter circuit and may be one of the following cases:

a plurality of choke inductors are connected in series; or one or more choke inductors and one or more capacitors are connected in parallel and then are connected in series with one or more choke inductors.

Further, in a possible design, the first circuit and the second circuit may be a one-stage filter circuit or two-stage filter circuit based on an actual requirement.

In a possible design, the first protection module includes a first device and a second device that are connected in parallel, and the first protection module 703 may be one of the following cases:

the first device is a transient voltage suppressor TVS and the second device is a capacitor;

the first device is a transient voltage suppressor TVS and the second device is not configured; or the first device is a capacitor, the second device is not configured, and a branch circuit corresponding to the second device is disconnected.

In a possible design, the second protection module 704 includes a third device and a fourth device that are connected in parallel, and may be one of the following cases:

the third device is a transient voltage suppressor TVS and the fourth device is a capacitor; or the third device is a capacitor, the fourth device is not configured, and a branch circuit corresponding to the second device is disconnected.

In a possible design, the third protection module 705 includes a fifth device and a sixth device that are connected in parallel, and may be one of the following cases:

the fifth device is a transient voltage suppressor TVS and the sixth device is a capacitor; or the fifth device is a transient voltage suppressor TVS, the sixth device is not configured, and a corresponding branch circuit corresponding to the second device is disconnected.

Further, in a possible design, a capacitor of the choke circuit may be implemented as a lumped capacitor or a coupling capacitor, for example, formed by coupling on a PCB.

Further, the choke inductors described in the foregoing embodiments are an inductor that acts as a choke, and a model of the choke inductors is selected based on an actual requirement.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A voice coil motor (VCM) protection circuit comprising:
 a VCM comprising:
  a first end; and
  a second end;
 a first choke circuit comprising:
  a first choke inductor;
  a third end coupled to the first end at a first node; and
  a fourth end;
 VCM drive circuit comprising:
  a power supply end (VDD) coupled to the fourth end at a third node;
  a reference ground (VCM_GND); and
  a current return end (ISINK); and
 a second choke circuit comprising:
  a second choke inductor;
  a fifth end coupled to the second end at a second node; and
  a sixth end coupled to the ISINK at a fifth node.

2. The VCM protection circuit of claim 1, wherein at least one of the first and second choke circuits comprises a single choke inductor.

3. The VCM protection circuit of claim 1, further comprising:
 a first protection system comprising:
  a seventh end coupled to the third node; and
  an eighth end coupled to a digital ground (DGND) at a fourth node;
 a second protection system comprising:
  a ninth end coupled to the third node; and
  a tenth end coupled to the VCM_GND at a seventh node; and
 a third protection system comprising:
  an eleventh end coupled to the fifth node; and
  a twelfth end coupled to the DGND at a sixth node.

4. The VCM protection circuit of claim 3, wherein the first protection system further comprises a first device and a second device coupled in parallel, and wherein the first device comprises a transient suppression diode (TVS) and the second device comprises a first capacitor.

5. The VCM protection circuit of claim 3, wherein the second protection system further comprises a third device and a fourth device coupled in parallel, and wherein the third device comprises a transient suppression diode (TVS) and the fourth device comprises a third capacitor.

6. The VCM protection circuit of claim 5, wherein the third protection system further comprises a fifth device and a sixth device that are coupled in parallel, and wherein:
 the fifth device comprises a transient suppression diode (TVS) and the sixth device comprises a fifth capacitor; or
 the fifth device comprises a TVS and the sixth device is not configured.

7. The VCM protection circuit of claim 1, wherein at least one choke circuit comprises two or more choke inductors coupled in parallel.

8. The VCM protection circuit of claim 1, wherein at least one choke circuit comprises one or more choke inductors coupled in parallel with one or more capacitors.

9. The VCM protection circuit of claim 1, wherein at least one choke circuit comprises two or more choke inductors coupled in series.

10. The VCM protection circuit of claim 1, wherein at least one choke circuit comprises one or more choke inductors and one or more capacitors coupled in parallel to form an inductor-capacitor system, and wherein the inductor-capacitor system is coupled in series with one or more additional choke inductors.

11. The VCM protection circuit of claim 3, wherein the first protection system further comprises a first device and a second device coupled in parallel, wherein the first device comprises a transient suppression diode (TVS), and wherein the second device is not configured.

12. The VCM protection circuit of claim 3, wherein the first protection system further comprises a first device and a second device coupled in parallel, wherein the first device comprises a second capacitor, and wherein the second device is not configured.

13. The VCM protection circuit of claim 3, wherein the second protection system further comprises a third device and a fourth device coupled in parallel, wherein the third device comprises a fourth capacitor, and wherein the fourth device is not configured.

14. A printed circuit board (PCB) of a voice coil motor (VCM) protection circuit comprising:
 a through hole; and
 a top layer comprising:
  a first circuit configured to be proximate to a first coil connection point of a VCM and comprising a first choke inductor;
  a second circuit configured to be proximate to a second coil connection point of the VCM and comprising a second choke inductor;
  a first protection system coupled to the first circuit and configured to be proximate to the first coil connection point, wherein the first protection system comprises a first current return end configured to directly couple to a digital ground (DGND) utilizing the through hole;
  a second protection system configured to couple to a VCM drive circuit and arranged proximate to the VCM drive circuit, wherein the second protection system comprises a second current return end configured to directly couple to a reference ground (VCM_GND) of the VCM drive circuit utilizing the through hole; and
  a third protection system coupled to the second circuit and arranged proximate to the second coil connection point, wherein the second protection system comprises a third current return end configured to directly couple to the DGND utilizing the through hole.

15. The PCB of claim 14, wherein the first protection system comprises a first device and a second device coupled in parallel, and wherein:
 the first device comprises a transient suppression diode (TVS) and the second device comprises a first capacitor;
 the first device comprises a TVS and the second device is not configured; or the first device comprises a second capacitor and the second device is not configured.

16. The PCB of claim 14, wherein the second protection system comprises a third device and a fourth device coupled in parallel, and wherein:
   the third device comprises a transient suppression diode (TVS) and the fourth device comprise a third capacitor; or
   the third device comprises a fourth capacitor and the fourth device is not configured.

17. The PCB of claim 14, wherein the third protection system comprises a fifth device and a sixth device coupled in parallel, and wherein:
   the fifth device comprises a transient suppression diode (TVS) and the sixth device comprises a fifth capacitor; or
   the fifth device comprises a TVS and the sixth device is not configured.

18. The PCB of claim 14, wherein wires of a power supply end (VCM_VDD) of the VCM drive circuit and the VCM_GND are routed in parallel and are completely wrapped by the DGND.

19. The PCB of claim 14, wherein a first wire between a power supply end (VCM_VDD) of the VCM drive circuit and a third coil connection point of the VCM and a second wire between a current return end (ISINK) of the VCM drive circuit and the third coil connection point are routed separately and are completely wrapped by the DGND.

20. The PCB of claim 14, wherein areas, from the top layer to a bottom layer, that correspond to wires and pads for connecting the first circuit and the second circuit to coil connection points of the VCM and that are on all layers of the PCB, are empty.

\* \* \* \* \*